United States Patent
Zhang et al.

(10) Patent No.: US 8,510,621 B2
(45) Date of Patent: Aug. 13, 2013

(54) METHOD AND APPARATUS FOR PROVIDING RESOURCE UNIT BASED DATA BLOCK PARTITION

(75) Inventors: Yan-Xiu Zhang, Shulin (TW); Yu-Chuan Fang, Yilan (TW); Chang-Lan Tsai, Zhubei (TW); Chung-Lien Ho, Guishan Shiang (TW)

(73) Assignee: Industrial Technology Research Institute, Hsinchu (TW)

(*) Notice: Subject to any disclaimer, the term of this patent is extended or adjusted under 35 U.S.C. 154(b) by 383 days.

(21) Appl. No.: 12/976,613

(22) Filed: Dec. 22, 2010

(65) Prior Publication Data

US 2011/0161771 A1    Jun. 30, 2011

Related U.S. Application Data

(60) Provisional application No. 61/290,774, filed on Dec. 29, 2009.

(51) Int. Cl.
*G06F 11/00* (2006.01)
(52) U.S. Cl.
USPC .......................................... 714/751; 370/319
(58) Field of Classification Search
None
See application file for complete search history.

(56) References Cited

U.S. PATENT DOCUMENTS

| | | | |
|---|---|---|---|
| 6,233,224 B1 | 5/2001 | Yamashita et al. | |
| 6,307,867 B1 | 10/2001 | Roobol et al. | |
| 7,072,971 B2 | 7/2006 | Lassen et al. | |
| 7,177,658 B2 | 2/2007 | Willenegger et al. | |
| 7,436,809 B2 * | 10/2008 | Harada et al. | 370/338 |
| 7,447,980 B2 | 11/2008 | Xu et al. | |
| 7,593,380 B1 | 9/2009 | Ferguson et al. | |
| 8,185,799 B2 * | 5/2012 | Choi et al. | 714/758 |
| 8,276,040 B2 * | 9/2012 | Lee et al. | 714/758 |
| 8,311,135 B2 * | 11/2012 | Suzuki | 375/260 |
| 8,325,760 B2 * | 12/2012 | Song et al. | 370/466 |
| 2007/0214399 A1 * | 9/2007 | Lim et al. | 714/746 |
| 2008/0101312 A1 | 5/2008 | Suzuki et al. | |
| 2008/0225784 A1 | 9/2008 | Tseng | |
| 2008/0240159 A1 | 10/2008 | Palanki et al. | |

(Continued)

FOREIGN PATENT DOCUMENTS

| | | |
|---|---|---|
| TW | 200718075 | 5/2007 |
| TW | I294744 | 3/2008 |

OTHER PUBLICATIONS

"Draft Amendment to IEEE Standard for Local and metropolitan area networks—Part 16: Air Interface for Fixed and Mobile Broadband Wireless Access Systems;" IEEE P802.16m/D3; dated Dec. 2009.

(Continued)

*Primary Examiner* — Christopher McCarthy
(74) *Attorney, Agent, or Firm* — Alston & Bird LLP

(57) ABSTRACT

A method of providing resource unit based data block partitioning may include determining, for a bit stream to be encoded in a coding scheme including an upper layer coding and a physical layer coding, whether upper layer coding is enabled. The method may further include, in response to the upper layer coding being enabled, partitioning the bit stream into one or more blocks for forward error correction coding. The one or more blocks may have a block size determined based on a size of a resource unit. The resource unit size may correspond to one or more units predefined in the physical layer for the resource allocation. A corresponding apparatus is also provided.

30 Claims, 9 Drawing Sheets

(56) References Cited

U.S. PATENT DOCUMENTS

| | | |
|---|---|---|
| 2009/0175210 A1 | 7/2009 | Vijayan et al. |
| 2009/0199066 A1 | 8/2009 | Kim et al. |
| 2009/0219990 A1* | 9/2009 | Han et al. .................. 375/240.02 |
| 2010/0226329 A1* | 9/2010 | Harel et al. ................... 370/329 |
| 2011/0002309 A1* | 1/2011 | Park et al. .................... 370/335 |
| 2011/0022918 A1* | 1/2011 | Kwon et al. .................. 714/748 |
| 2011/0296270 A1* | 12/2011 | Lim et al. ...................... 714/752 |
| 2012/0110421 A1* | 5/2012 | Ganga et al. .................. 714/776 |
| 2012/0195216 A1* | 8/2012 | Wu et al. ....................... 370/252 |

OTHER PUBLICATIONS

"*Draft Amendment to IEEE Standard for Local and metropolitan area networks — Part 16: Air Interface for Fixed and Mobile Broadband Wireless Access Systems*;" IEEE P802.16m/D6; dated May 2010.

"*Introduction of the Multimedia Broadcast Multicast Service (MBMS) in the Radio Access Network (RAN), Stage 2*;" 3GPP TS 25.346 V8.1.0;, Release 8; dated Mar. 2008.

"*Multimedia Broadcast/Multicast Service (MBMS), Protocols and codecs*;" 3GPP TS 26.346 V7.8.0; Release 7; dated Jun. 2008.

* cited by examiner

METHOD AND APPARATUS FOR PROVIDING RESOURCE UNIT BASED DATA BLOCK PARTITION

CROSS REFERENCE TO RELATED APPLICATION

This application claims the benefit of U.S. Provisional Application No. 61/290,774, filed Dec. 29, 2009, the contents of which are incorporated herein in their entirety.

TECHNOLOGICAL FIELD

Embodiments of the present disclosure relate generally to wireless communication technology and, more particularly, relate to a method and apparatus for providing resource unit based data block partition.

BACKGROUND

In general, forward error correction (FEC) technologies protect data by encoding the original source data at the sender such that redundant data is added. A FEC decoding algorithm then allows the receiver to detect and possibly correct errors in the original data based solely on the data that has been received.

In modern multicast and broadcast service (MBS) communication systems, FEC technology may be generally employed in two complementary ways. First, FEC technology may be used at the physical layer by using the channel coding scheme to correct bit errors. Second, FEC technology may be used at an upper layer (e.g., an application layer or transport layer) using another coding scheme such as, for example, fountain code or raptor code, to recover lost packets. While the FEC at the physical layer attempts to ensure that all the actually received bits are correct, the FEC provided by the upper layer coding scheme attempts to recover missing data. The channel coding scheme may adopt turbo codes, convolutional codes, LDPC codes, etc., and the upper layer coding scheme may employ Reed-Solomon (RS) codes, fountain codes, raptor codes, Luby transform (LT) codes, Tornado codes, etc. Raptor codes, for example, have been adopted into multiple standards for both file delivery and streaming applications, including the 3GPP MBMS standards (Third Generation Partnership Program Multimedia Broadcast/Multicast Service) for broadcast file delivery and streaming services, the DVB-H IPDC standard (Digital Video Broadcast Handheld Internet Protocol Datacast), the DVB-IPI IPTV standard for delivering commercial TV services over an IP network, and multiple other standards.

The IEEE 802.16m standard organization, which is currently competing as a 4G standard, may also utilize this kind of complementary FEC technology to enhance the reliability and efficiency of the MBS. However, some problems may be induced by the complementary FEC method. FIG. 1 shows an exemplary coding scheme in which a code is used to encode multiple data blocks and generate more encoded blocks. The encoded block may be formed by modulo-2 adding some of data blocks or may be directly mapped into one of data blocks. Therefore, the data blocks may be mutually connected. For example, X=A, Y=A⊕B and Z=A⊕B⊕C at the encoder of the transmitter, where ⊕ represents the bit-wise modulo-2 addition. At the receiver, some known encoded blocks which are recovered may restore the related data blocks. In FIG. 1, for example, if X can be recovered, A is equal to X. If A is known, B may be obtained by calculating Y⊕A.

Given a data file, if the file is divided into more data blocks, the encoded blocks may have more possible combinations of data blocks. This may result in more robust coding. In other words, a smaller data block size may provide a more robust coding scheme. However, the coding scheme at the physical layer may not have a preference for this manner. Taking turbo code as an example, the minimum distance may be larger if the turbo codeword length is longer and better error performance may result. When the coding schemes with these two different characteristics are utilized, the mismatch may induce some problems. FIG. 2 provides an example illustrating the data flow between the physical (PHY) layer coding and the upper layer coding. At first, the data blocks may be encoded to form the encoded blocks by the upper layer coding scheme. In this example, five encoded blocks may be grouped and encoded by one FEC encoder. Finally, these bits in FEC encoded blocks may be modulated into symbols, and then the symbols may be mapped into the resource allocation. In other words, multiple data blocks may be not only mapped into a larger FEC block, but also mapped into large resources.

The larger blocks may imply larger storage and induce longer latency at the receiver. The data blocks may need a relatively long time to be collected on the receiver side since larger packets are received. In addition, while multiple data blocks may be mapped into one FEC block, a single FEC decoding failure may induce contiguous errors to multiple data blocks such that the upper layer coding scheme may not recover the missed data blocks. For example, in 3GPP TS 25.346, data block sizes of 384 bits, 1024 bits and 4096 bits are recommended. If a 6144 bit FEC block is used, one erroneous FEC block may cause 16 data block errors when a 384 bit data block is used. Additionally, if a few encoded blocks are further required by the upper layer decoding, an FEC block comprising many encoded blocks may induce resource waste. Moreover, the upper layer coding may require other error detection. However, more redundant bits may cause extra error detection overhead, e.g., CRC (cyclic redundancy check) overhead.

The bits in FEC encoded blocks may be modulated into modulation symbols, and then the modulation symbols may be mapped into the resource allocation. For OFDMA systems, the resources are composed of frequency domain (also known as subcarrier domain) and time domain (also known as subframe domain or OFDMA symbol domain). In IEEE 802.16m, a unit for resource allocation is defined as the resource unit (RU). An RU comprises $P_{sc}$ consecutive subcarriers by $N_{sym}$ consecutive OFDMA symbols. $P_{sc}$ is 18 subcarriers and $N_s$), is 6, 7, and 5 OFDMA symbols for type-1, type-2, and type-3 AAI subframes respectively. Besides, several kinds of resource allocation unit are also defined, for example, a physical resource unit (PRU), a logical resource unit (LRU), a sub-band and a mini-band. The PRU and LRU have the same size as the RU. A sub-band and a mini-band comprise four and one adjacent PRUs, respectively.

In 3GPP Long Term Evolution (LTE) (3GPP TS 36.211), a unit for resource allocation is defined as the resource block (RB). An RB consists of 7 or 6 consecutive SC-FDMA symbols in the time domain by 12 consecutive subcarriers in the frequency domain.

BRIEF SUMMARY

A method and apparatus are therefore provided for enabling the provision of a resource unit based data block partition. For example, some embodiments may relate to data block partition, and scheduling and resource configuration in order to address some of the problems described above.

In one exemplary embodiment, a method of providing resource unit based data block partitioning is provided. The method may include determining a number of used resource units for a forward error correction (FEC) block at the physical layer, determining a number of information bits to one FEC block based on the number of used resource units; and determining the size of data block of upper layer coding based on the number of information bits of one FEC block for the upper layer coding.

In another exemplary embodiment, an apparatus for providing resource unit based data block partitioning is provided. The apparatus may include processing circuitry configuring the apparatus for determining a number of used resource units for a forward error correction (FEC) block at the physical layer, determining a number of information bits to one FEC block based on the number of used resource units; and determining the size of data block of upper layer coding based on the number of information bits of one FEC block for the upper layer coding.

In another exemplary embodiment, a method for decoding data employing resource unit based data block partitioning is provided. The method may include receiving a bit stream encoded in a coding scheme including an upper layer coding and a physical layer coding and decoding the bit stream based on the bit stream being partitioned into one or more blocks for forward error correction coding. The one or more blocks may have a block size determined based on a size of a resource unit. The resource unit size may correspond to one or more units predefined in the physical layer for the resource allocation.

In another exemplary embodiment, an apparatus for decoding data employing resource unit based data block partitioning is provided. The apparatus may include processing circuitry configuring the apparatus for receiving a bit stream encoded in a coding scheme including an upper layer coding and a physical layer coding and decoding the bit stream based on the bit stream being partitioned into one or more blocks for forward error correction coding. The one or more blocks may have a block size determined based on a size of a resource unit. The resource unit size may correspond to one or more units predefined in the physical layer for the resource allocation.

Some embodiments may therefore provide a methods, apparatus and system that may provide device users with improved capabilities and user experience with respect to accessing wireless networks via mobile devices.

BRIEF DESCRIPTION OF THE SEVERAL VIEWS OF THE DRAWING(S)

The foregoing summary, as well as the following detailed description of the disclosure, will be better understood when read in conjunction with the appended drawings. For the purpose of illustrating embodiments, there are shown in the drawings embodiments which are examples. It should be understood, however, that the invention is not limited to the precise arrangements and instrumentalities shown. In the drawings:

FIG. 1 shows an exemplary coding scheme in which the code used encodes multiple data blocks and generates more encoded blocks;

FIG. 2 provides an example illustrating the data flow between the physical layer and the upper layer coding;

Figure 5:
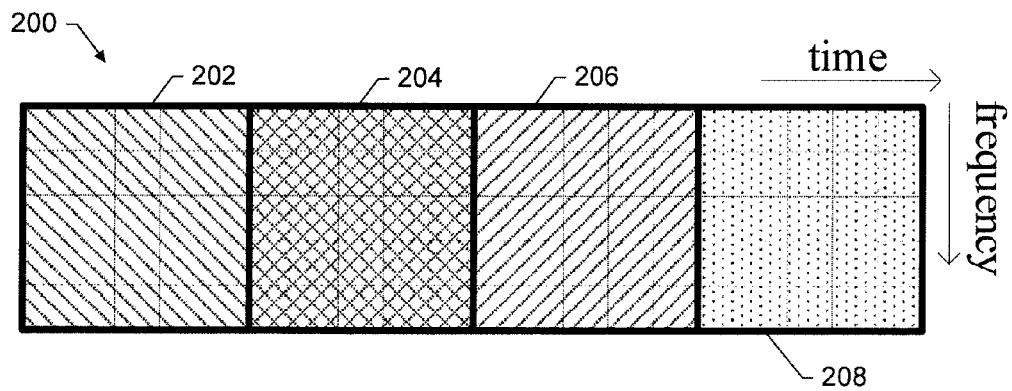
Figure 6:
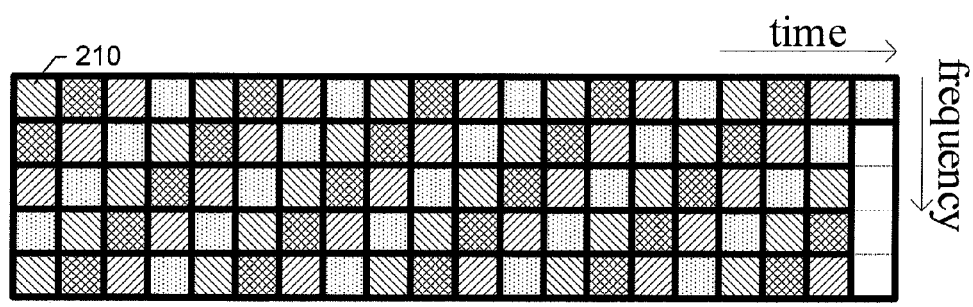
Figure 7:
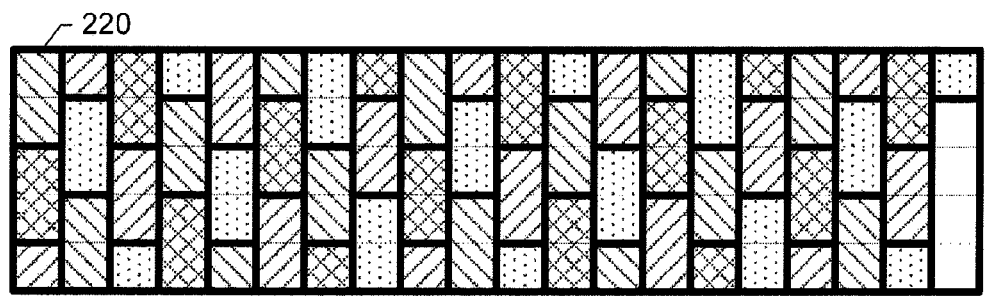
Figure 8:
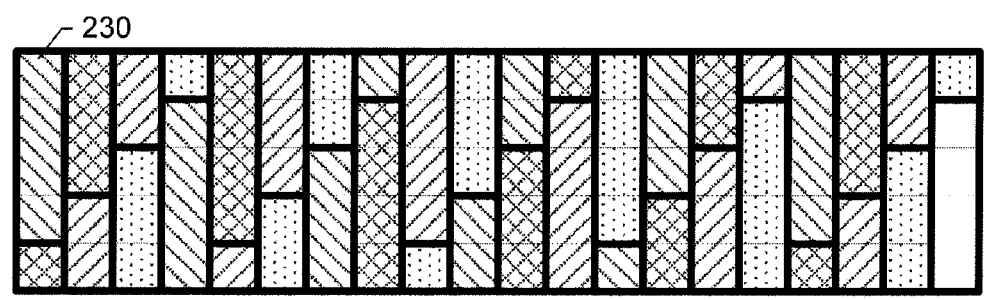
Figure 9:
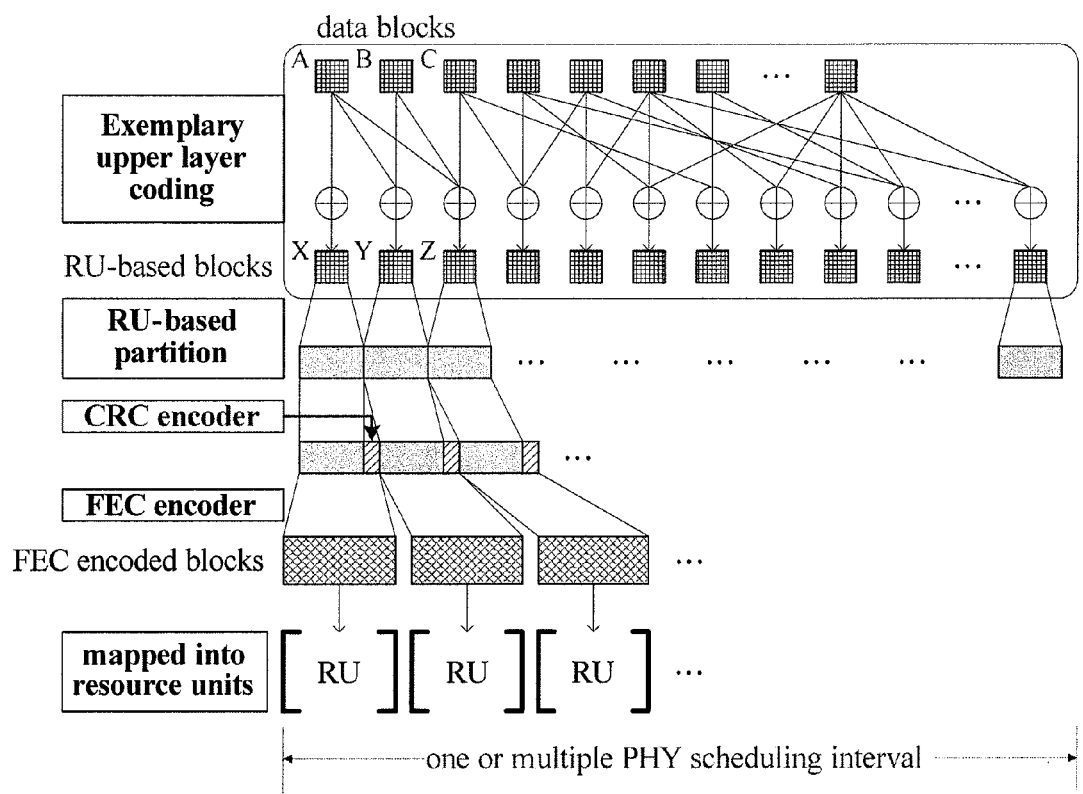
Figure 10:
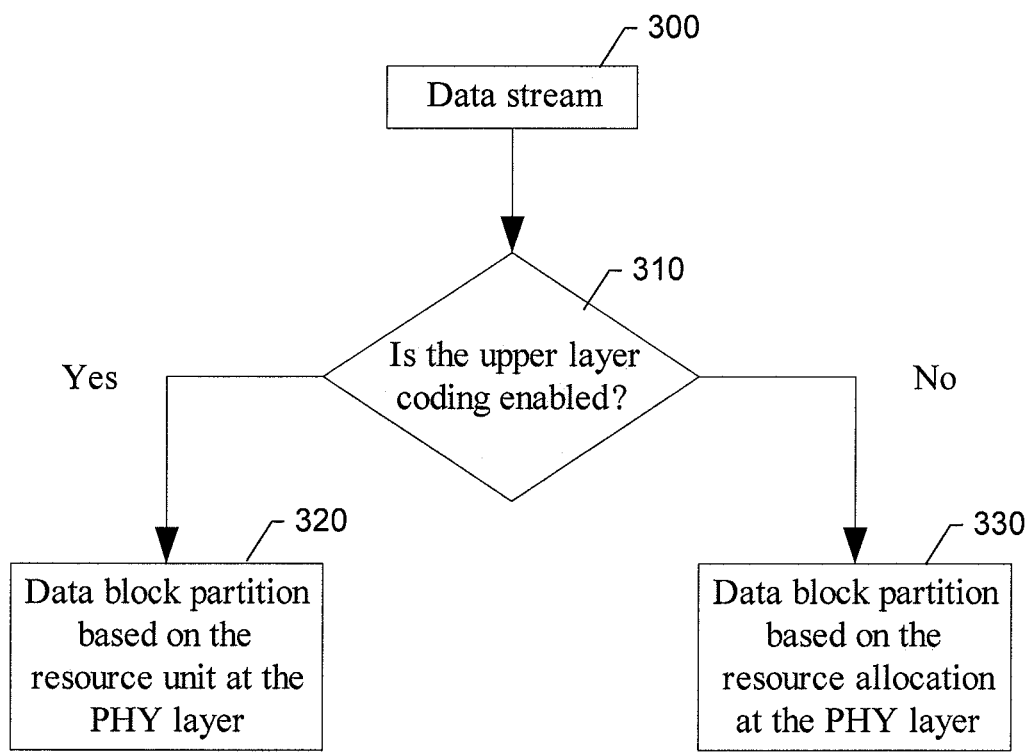
Figure 11:
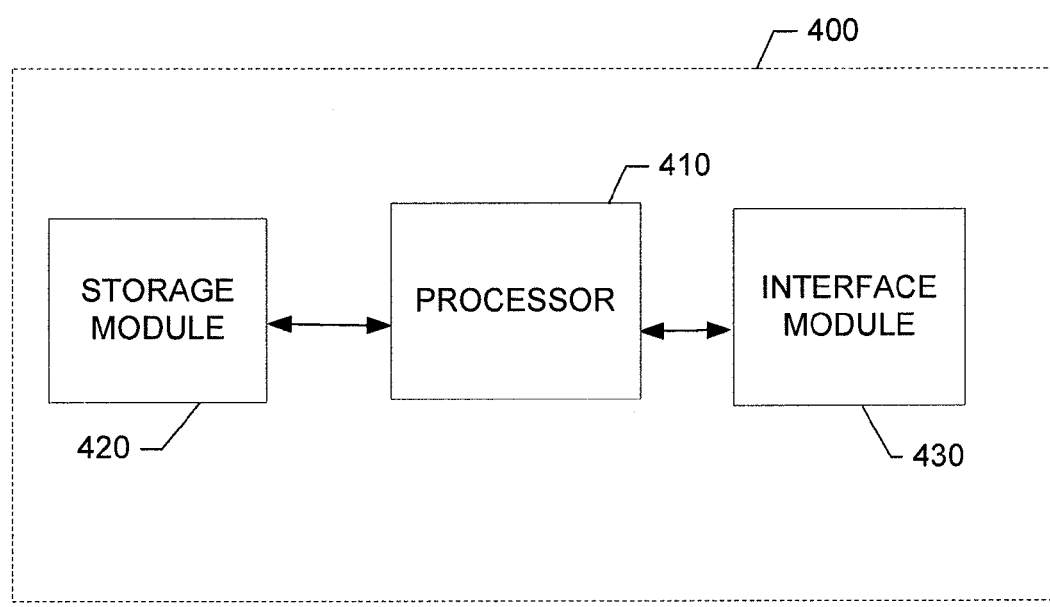
Figure 12:
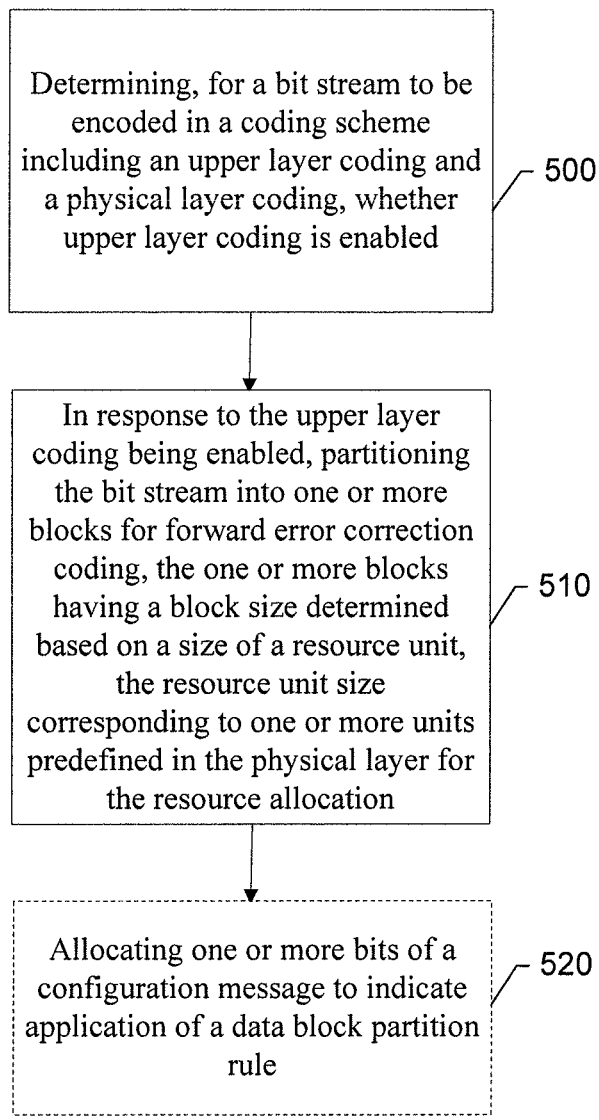
Figure 13:
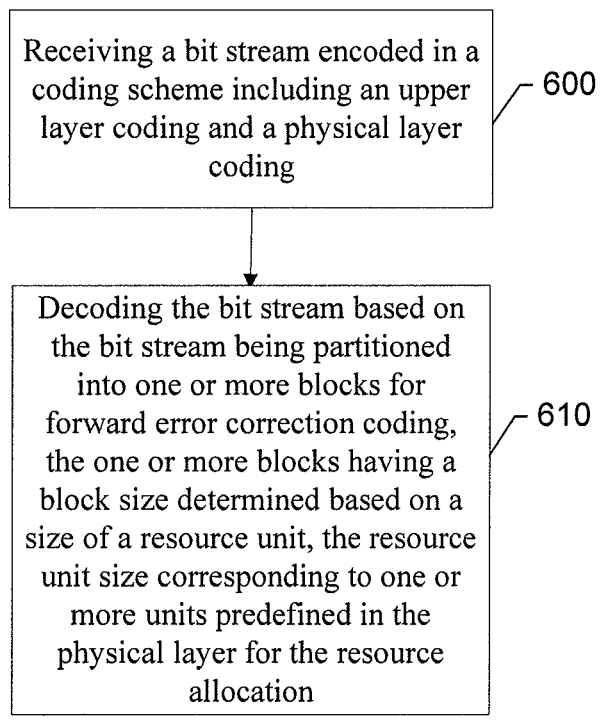

FIG. 5 provides another example of forward error correction code block mapping to a resource that may be used in connection with an exemplary embodiment;

FIG. 6 illustrates an example of resource allocation for resource unit based data block partition according to an exemplary embodiment;

FIG. 7 illustrates an example where the forward error correction block size is restricted to fill two resource units according to an exemplary embodiment;

FIG. 8 illustrates an example where the forward error correction block size is restricted to a sub-band according to an exemplary embodiment;

FIG. 9 illustrates an exemplary coding chain provided at a per scheduling interval according to an exemplary embodiment;

FIG. 10 is a block diagram according to a process flow for determining different manners to employ coding schemes for different purposes or applications in a communication system according to an exemplary embodiment;

FIG. 11 is a block diagram according to an apparatus for providing resource unit based data block partitioning according to an exemplary embodiment;

FIG. 12 is a block diagram according to a method of providing resource unit based data block partitioning according to an exemplary embodiment; and FIG. 13 is a block diagram according to a method for decoding data employing resource unit based data block partitioning according to an exemplary embodiment.

DETAILED DESCRIPTION

Reference will now be made in detail to the present embodiments of the disclosure, examples of which are illustrated in the accompanying drawings. Wherever possible, the same reference numbers will be used throughout the drawings to refer to the same or like parts. As used herein, the terms "data," "content," "information" and similar terms may be used interchangeably to refer to data capable of being transmitted, received and/or stored in accordance with exemplary embodiments. Moreover, the term "exemplary," as used herein, is not provided to convey any qualitative assessment, but instead merely to convey an illustration of an example. Thus, use of any such terms should not be taken to limit the spirit and scope of embodiments of the present disclosure.

As indicated above, FEC technology may be employed at the physical layer using the channel coding scheme to correct bit errors, and at the upper layer (e.g., application layer or transport layer) using another coding scheme to recover lost packets. Thus, while the FEC at the physical layer attempts to ensure that all the actually received bits are correct, the FEC provided by the upper layer coding scheme attempts to recover missing data. Generally speaking, larger blocks imply larger storage and longer latency required at the receiver. In addition, while multiple data blocks may mapped into one physical layer (PHY) FEC block, PHY FEC decoding failure may induce errors to multiple data blocks such that the upper layer coding scheme may not recover them.

Some exemplary embodiments are provided herein that may address some of these issues by applying a resource unit based data block partition method. Resource configuration methods are also discussed herein. Some exemplary embodiments may address issues such as large storage overhead, reception latency, contiguous errors, resource waste and error detection overhead via cooperation between the physical layer and the upper layer in connection with a burst partition method.

For MBS in connection with an exemplary embodiment, it may be desirable to restrict the FEC block size to a smaller size in order to reduce storage overhead and reception latency. Accordingly, some exemplary embodiments use a resource unit as the unit for the data block to improve MBS, where the resource unit is smaller than the total allocated radio resource. Thus, contrary to popular conventional coding concepts, some exemplary embodiments choose smaller FEC blocks instead of the largest FEC block which renders the best error correction performance.

As an example, the resource unit may be defined as one or multiple RU (resource unit, whose size is the same as logical RU (LRU) or physical RU (PRU)) in IEEE 802.16m. Furthermore, the resource unit may be defined as one or multiple sub-bands, one or multiple mini-bands or the like. Thus, the FEC block size may be based on the resource unit size which may be smaller than the total allocated resource. In an exemplary embodiment, the RU may correspond to 6 symbols each having 18 subcarriers for a total of 108 tones in IEEE 802.16m. In 3GPP Long Term Evolution (LTE), the resource unit may be defined as one or multiple RBs (resource block), so the FEC block size may be based on the resource unit size which may be smaller than the total allocated resource. For example, FEC CRC could be reused for data block error detection to reduce CRC overhead.

The upper layer coding scheme (e.g., fountain codes, raptor codes, RS codes or the like) encodes data per one or multiple PHY scheduling intervals to reduce buffer and latency at the receiver side. In some cases, the PHY scheduling interval may be set to the enhanced MBS (E-MBS) scheduling interval (MSI) in IEEE 802.16m (or other WiMAX related standards), which refers to a number of successive super-frames for which the access network may schedule traffic for the streams associated with the MBS Zone prior to the start of the interval. The MSI may be, for example, 2, 4, 8 or 16 superframes long depending on the particular use case of E-MBS.

Figure 1:
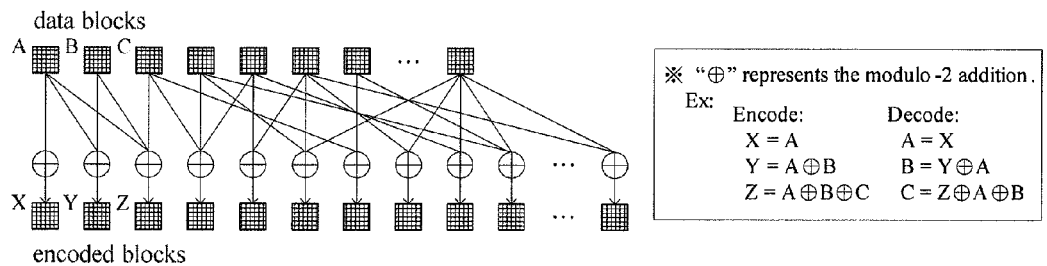
Figure 2:
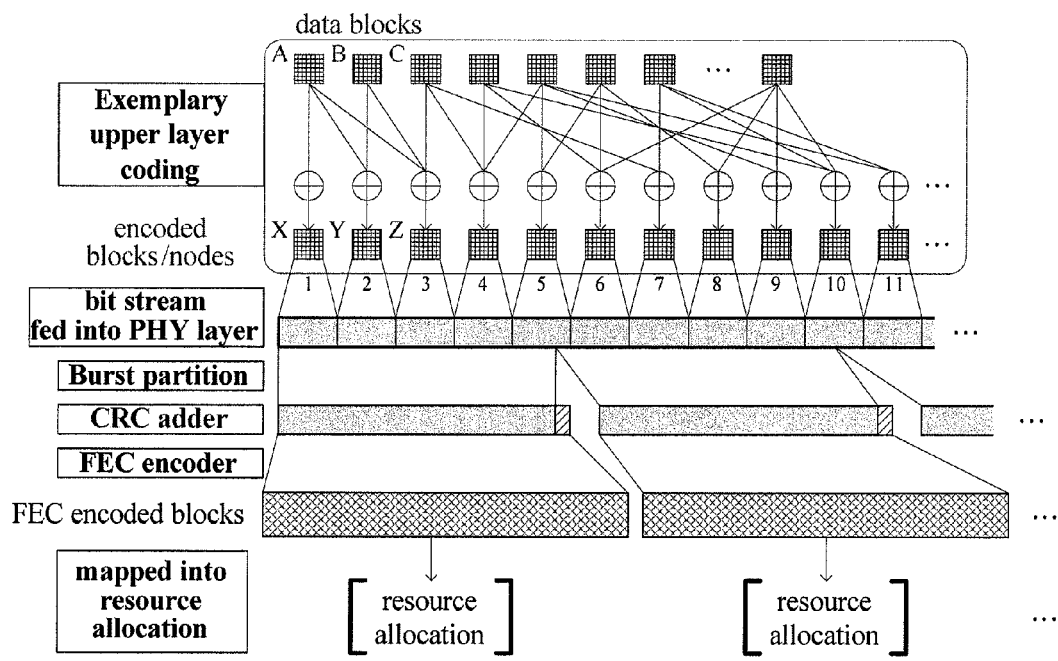
Figure 3:
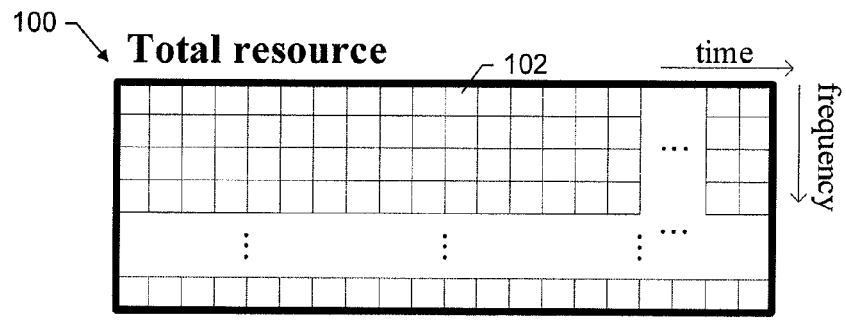
FIG. 3 illustrates an example of the resource allocation for a resource unit based coding block according to an exemplary embodiment.

FIG. 3 illustrates an example of a resource unit based (RU-based) coding block according to an exemplary embodiment. In FIG. 3, the entire block 100 represents the total available resource. A portion of the block 100 (e.g., sub-block 102) indicates a resource unit and occupies the time duration of one subframe and the frequency duration of one sub-band, mini-band, or one or more RUs/RBs. Thus, one FEC coding block may fill a portion of the sub-block 102.

Figure 4:
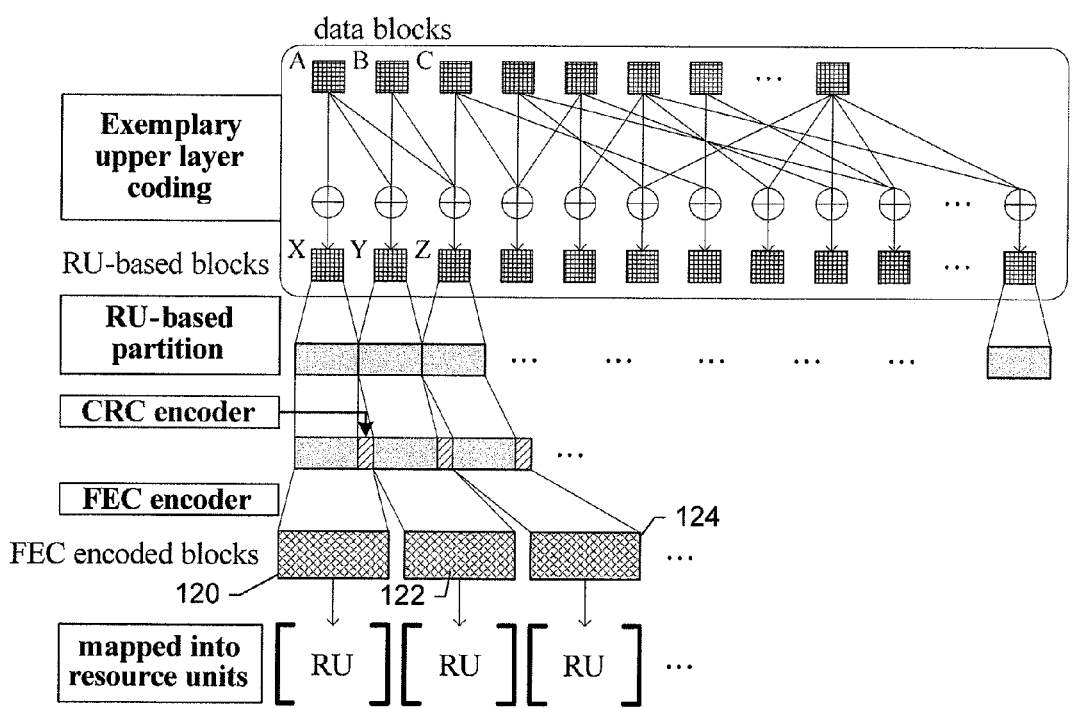
FIG. 4 illustrates an exemplary data flow to explain resource unit based data block partition of an exemplary method in the transmitter.

FIG. 4 illustrates an exemplary data flow to explain resource unit based (RU-based) data block partition of an exemplary method in the transmitter. As shown in FIG. 4, the data blocks (A, B, C, etc.) may be initially encoded to form the encoded blocks (X, Y, Z, etc.) by the upper layer coding scheme which may employ, for example, fountain codes, raptor codes, etc. Then, each of the encoded blocks may be encoded by CRC, e.g., 16-bit CRC or 8-bit CRC. The CRC added encoded block may be fed into an FEC encoder to generate FEC encoded blocks (e.g., 120, 122, 124, etc.) according to an appropriate code rate. Finally, these bits in FEC encoded blocks may be modulated, and then the symbols may be mapped into resource units (RUs). In an exemplary embodiment, the bits of one data block may be allowed to be mapped into one resource unit. Thus, for example, the RU-based partition may provide for each RU-based block (X, Y, Z, etc.) to be partitioned into what will ultimately be a corresponding resource unit. In FIG. 4, the resource unit is an LRU. Therefore, the encoded blocks outputted by the upper layer coding may be called resource unit based bocks. It should be noted that other functional blocks beyond those shown in FIG. 4 may exist between any of the functional blocks that are illustrated in FIG. 4. According to the example of FIG. 4, at the receiver, the FEC decoder may decode data per LRU, and X, Y and Z may be sequentially obtained so that A, B and C can be decoded.

Tables 1-3 below introduce burst partition rules from IEEE 802.16m/D3. The burst sizes ($N_{DB}$) listed in Table 1 may be supported in the PHY layer. These sizes include the addition of CRC (per burst and per FEC block) when applicable. Other sizes may require padding to the next burst size. When the burst size including 16 burst CRC bits exceeds the maximum FEC block size, e.g., 600 bytes, the burst may be partitioned into $K_{FB}$ FEC blocks. The burst size may be determined by the three following tables with parameters—allocation size (the size of resource allocation), modulation order and effective code rate according to the link adaptation.

TABLE 1 burst size

| ids | $N_{DB}$ (byte) | $K_{FB}$ |
| --- | --- | --- |
| 1 | 6 | 1 |
| 2 | 8 | 1 |
| 3 | 9 | 1 |
| 4 | 10 | 1 |
| 5 | 11 | 1 |
| 6 | 12 | 1 |
| 7 | 13 | 1 |
| 8 | 15 | 1 |
| 9 | 17 | 1 |
| 10 | 19 | 1 |
| 11 | 22 | 1 |
| 12 | 25 | 1 |
| 13 | 27 | 1 |
| 14 | 31 | 1 |
| 15 | 36 | 1 |
| 16 | 40 | 1 |
| 17 | 44 | 1 |
| 18 | 50 | 1 |
| 19 | 57 | 1 |
| 20 | 64 | 1 |
| 21 | 71 | 1 |
| 22 | 80 | 1 |
| 23 | 90 | 1 |
| 24 | 100 | 1 |
| 25 | 114 | 1 |
| 26 | 128 | 1 |
| 27 | 144 | 1 |
| 28 | 164 | 1 |
| 29 | 180 | 1 |
| 30 | 204 | 1 |
| 31 | 232 | 1 |
| 32 | 264 | 1 |
| 33 | 296 | 1 |
| 34 | 328 | 1 |
| 35 | 368 | 1 |
| 36 | 416 | 1 |
| 37 | 472 | 1 |
| 38 | 528 | 1 |
| 39 | 600 | 1 |
| 40 | 656 | 2 |
| 41 | 736 | 2 |
| 42 | 832 | 2 |
| 43 | 944 | 2 |
| 44 | 1056 | 2 |
| 45 | 1200 | 2 |
| 46 | 1416 | 3 |
| 47 | 1584 | 3 |
| 48 | 1800 | 3 |
| 49 | 1888 | 4 |
| 50 | 2112 | 4 |
| 51 | 2400 | 4 |

TABLE 1-continued burst size

| ids | $N_{DB}$ (byte) | $K_{FB}$ |
|---|---|---|
| 52 | 2640 | 5 |
| 53 | 3000 | 5 |
| 54 | 3600 | 6 |
| 55 | 4200 | 7 |
| 56 | 4800 | 8 |
| 57 | 5400 | 9 |
| 58 | 6000 | 10 |
| 59 | 6600 | 11 |
| 60 | 7200 | 12 |
| 61 | 7800 | 13 |
| 62 | 8400 | 14 |
| 63 | 9600 | 16 |
| 64 | 10800 | 18 |
| 65 | 12000 | 20 |
| 66 | 14400 | 24 |

The burst size index may be calculated as idx=$I_{MinimalSize}$+$I_{SizeOffset}$, where $I_{MinimalSize}$ may be calculated based on the allocation size as shown in Table 2. The allocation size may be defined as the number of LRUs multiplied by the MIMO rank that are allocated for the burst. The modulation order $N_{mod}$ (e.g., 2 for QPSK, 4 for 16-QAM and 6 for 64-QAM) depends on the parameter $I_{SizeOffset}$ according to Table 3. Allocation size of 1 or 2 LRUs may be special cases (separate columns in the table). For allocation of at least 3 LRUs, the modulation order depends only on $I_{SizeOffset}$. The allocation size and the value of $I_{SizeOffset}$ may be set by an ABS (advanced base station) scheduler, which takes into account the resulting modulation order and effective code rate, and according to the link adaptation.

TABLE 2 minimal size index as a function of the allocation size

| Allocation size | $I_{MinimalSize}$ |
|---|---|
| 1~3 | 1 |
| 4 | 2 |
| 5 | 4 |
| 6 | 6 |
| 7 | 8 |
| 8 | 9 |
| 9 | 10 |
| 10~11 | 11 |
| 12 | 12 |
| 13 | 13 |
| 14~15 | 14 |
| 16~18 | 15 |
| 19~20 | 16 |
| 21~22 | 17 |
| 23~25 | 18 |
| 26~28 | 19 |
| 29~32 | 20 |
| 33~35 | 21 |
| 36~40 | 22 |
| 41~45 | 23 |
| 46~50 | 24 |
| 51~57 | 25 |
| 58~64 | 26 |
| 65~72 | 27 |
| 73~82 | 28 |
| 83~90 | 29 |
| 91~102 | 30 |
| 103~116 | 31 |
| 117~131 | 32 |
| 132~145 | 33 |
| 146~164 | 34 |
| 165~184 | 35 |
| 185~192 | 36 |

TABLE 2-continued minimal size index as a function of the allocation size

| Allocation size | $I_{MinimalSize}$ |
|---|---|

TABLE 3 rules for modulation order

| $I_{SizeOffset}$ | $N_{mod}$ (allocation size > 2) | $N_{mod}$ (allocation size = 2) | $N_{mod}$ (allocation size = 1) |
|---|---|---|---|
| 0~9 | 2 | 2 | 2 |
| 10~15 | 2 | 2 | 4 |
| 16~18 | 2 | 4 | 6 |
| 19~21 | 4 | 4 | 6 |
| 22~23 | 4 | 6 | 6 |
| 24~31 | 6 | 6 | 6 |

In another exemplary embodiment, an exemplary resource unit based data block partition may be provided such that, if the allocation sizes are restricted to 1-4 RUs, only the burst sizes of idx 1-33 in Table 1 remain. E-MBS may utilize these 33 kinds of burst size.

In another exemplary embodiment, if allocation sizes are restricted to 1-8 RUs, only the burst sizes of idx 1-40 in Table 1 remain. E-MBS may utilize these 40 kinds of burst size. FIG. 5 provides another example that may be used in connection with IEEE 802.16m/D3. Assume the total resource size is 100 RUs and the burst size is 19,200 bits, where one RU comprises 96 data tones. 16-QAM may be used with a nominal rate of ½. According to this example, the burst 200, which may be divided into 4 FEC blocks (e.g., block 202, block 204, block 206 and block 208) with each block including 4800 bits. According to the example shown in FIG. 3, the four FEC blocks mapped to the total resources may be as shown in FIG. 5. The following exemplary embodiments may be used to implement resource unit based data block partition according to an exemplary method when the total transmitted data is 19,200 bits.

FIG. 6 illustrates an example of resource allocation for RU-based data block partition. In this regard, if the resource unit 210 is defined as an RU and the FEC block size is restricted to the size of the resource unit 210 (i.e., an RU), the total transmitted data may be partitioned such that each burst has an FEC block comprising 200 bits. The actual code rate may be about 0.52. As shown in FIG. 6, four RUs may remain (e.g., in the bottom right corner of the exemplary large block of FIG. 6) and may be utilized by other traffic (e.g., unicast). The cross hatching of respective blocks in FIG. 6 helps to illustrate the size of each respective FEC block of about 200 bits.

In some cases, the data block partitioning may be accomplished to provide a two-RU based data block partition. FIG. 7 illustrates an example where the resource unit 220 is defined as two RUs and the FEC block size is restricted to the size of the resource unit 220 that fills two RUs. In such an example, the total transmitted data may be partitioned such that each burst has a FEC block of about 400 bits. The actual code rate may be about 0.52. As shown in FIG. 7, four RUs may remain (e.g., in the bottom right corner of the exemplary large block of FIG. 7) and may be utilized by other traffic (e.g., unicast). The cross hatching of respective blocks in FIG. 7 helps to illustrate the size of each respective FEC block of about 400 bits.

In some cases, the data block partitioning may be accomplished to provide resource allocation for sub-band-based data block partition. FIG. 8 illustrates an example where the resource unit 230 is defined as one sub-band (i.e., four RUs) and the FEC block size is restricted to the resource unit 230 size that is the size of a sub-band. In such an example, the total transmitted data may be partitioned such that each burst has a FEC block of about 800 bits. The actual code rate may be about 0.52. As shown in FIG. 8, four RUs may remain (e.g., in the bottom right corner of the exemplary large block of FIG. 8) and may be utilized by other traffic (e.g., unicast). The cross hatching of respective blocks in FIG. 8 helps to illustrate the size of each respective FEC block of about 800 bits.

In an exemplary embodiment, the upper layer coding may encode data per scheduling interval. The upper layer coding scheme (e.g., fountain codes, raptor codes, RS codes, or the like) may be used to encode data per one or multiple PHY scheduling intervals to reduce register size and latency at the receiver side as shown in FIG. 9. FIG. 9 illustrates an exemplary coding chain provided per scheduling interval according to an exemplary embodiment.

Communication systems employing exemplary embodiments may, in some cases, employ the coding schemes in a different manner for different purposes or applications as shown in FIG. 10. For example, in some cases, a data stream 300 may be provided and a determination may be made as to whether upper layer coding is enabled at operation 310. If the upper layer coding is enabled, data block partition may be accomplished based on the resource unit at the PHY layer at operation 320. Meanwhile, if the upper layer coding is not enabled, data block partition may be accomplished based on the resource allocation for the corresponding mobile station at the PHY layer at operation 330.

In some embodiments, the resource configuration may be investigated (e.g., for MBS configuration messages) in connection with allocation of one or multiple bits to indicate whether a corresponding kind of data block partition rule is applied in the system. In an exemplary embodiment, rules may be configured in a global setting message. For example, in IEEE 802.16m, rules may be provided by AAI-E-MBS-CFG to announce that all MBS services are to apply a corresponding kind of FEC encoding rule through E-MBS_PARTITION_INDICATOR as shown below in Table 4. The E-MBS_PARTITION_INDICATOR may be the same for all E-MBS zones.

TABLE 4

Exemplary embodiment of resource configuration indicating E-MBS partition

| Syntax | Size (bits) | Notes |
|---|---|---|
| AAI-E-MBS-CFG_Message_Format( ) { | | |
| Num_E-MBS_Zones | 3 | Number of E-MBS Zones with which the ABS may be associated. |
| E-MBS_PARTITION_INDICATOR | | 0: unicast partition rule; 1: E-MBS partition rule |
| E-MBS_SUBFRAME_INDICATOR | 3 | The number of subframes in each frame duration |
| E-MBS_SUB-BAND_INDICATOR | Variable | Number of sub-bands for E-MBS region which may be represented by 5, 4, or 3 bits for 2048, 1024, or 512 FFT size, respectively. |

TABLE 4-continued

Exemplary embodiment of resource configuration indicating E-MBS partition

| Syntax | Size (bits) | Notes |
|---|---|---|
| for(i=0; i< Num_E-MBS_Zones; i++) { | | |
| E-MBS_Zone_ID | 7 | The EMBS_Zone_ID to which this EMBS MAP applies. |
| MSI Length | 2 | The length of an MSI in units of the number of superframes<br>0b00: 2 superframes, 40 ms<br>0b01: 4 superframes, 80 ms<br>0b10: 8 superframes, 160 ms<br>0b11: 16 superframes, 320 ms |
| E-MBS MAP Resource Index | | Resource index includes location and allocation size. |
| E-MBS MAP $I_{SizeOffset}$ | 5 | |
| } | | |
| } | | |

In some embodiments, a rule may be configured according to E-MBS zones in a global setting message. For example, in IEEE 802.16m, rules may be provided by AAI-E-MBS-CFG to announce that all MBS services in a corresponding E-MBS zone are to apply a corresponding kind of FEC encoding rule through E-MBS_PARTITION_INDICATOR as shown below in Table 5. The E-MBS_PARTITION_INDICATOR may indicate the status for each respective E-MBS zone.

TABLE 5

Exemplary embodiment of resource configuration indicating E-MBS partition

| Syntax | Size (bits) | Notes |
|---|---|---|
| AAI-E-MBS-CFG_Message_Format( ) { | | |
| Num_E-MBS_Zones | 3 | Number of E-MBS Zones with which the ABS may be associated. |
| E-MBS_SUBFRAME_INDICATOR | 3 | The number of subframes in each frame duration |
| E-MBS_SUB-BAND_INDICATOR | Variable | Number of sub-bands for E-MBS region which may be represented by 5, 4, or 3 bits for 2048, 1024, or 512 FFT size, respectively. |
| for(i=0; i< Num_E-MBS_Zones; i++) { | | |
| E-MBS_PARTITION_INDICATOR | | 0: unicast partition rule; 1: E-MBS partition rule |
| E-MBS_Zone_ID | 7 | The EMBS_Zone_ID to which this EMBS MAP applies. |
| MSI Length | 2 | The length of an MSI in units of the number of superframes<br>0b00: 2 superframes, 40 ms<br>0b01: 4 superframes, 80 ms<br>0b10: 8 superframes, 160 ms<br>0b11: 16 superframes, 320 ms |
| E-MBS MAP Resource Index | | Resource index includes location and allocation size. |
| E-MBS MAP $I_{SizeOffset}$ | 5 | |
| } | | |
| } | | |

In an exemplary embodiment, a rule may be configured in an E-MBS zone setting message for a plurality of (or all) services. For example, in IEEE 802.16m, rules may be provided by E-MBS MAP to indicate that all services within a zone are to apply a corresponding kind of rule through an E-MBS_PARTITION_INDICATOR as shown below in Table 6. The E-MBS_PARTITION_INDICATOR may be the same for all flows in the corresponding E-MBS zone.

TABLE 6

Exemplary embodiment of resource configuration indicating E-MBS partition

| Syntax | Size (bits) | Notes |
|---|---|---|
| E-MBS-DATA_IE( ) { | | |
|   No. of MSTID+FIDs | 8 | Total number of E-MBS streams in the IE. |
|   E-MBS_PARTITION_INDICATOR | | 0: unicast partition rule; 1: E-MBS partition rule |
|   for(i=0; i< No. of MSTID+FIDs; i++) { | | |
|     MSTIF+FID | 16 | Multicast STID + Flow ID of an E-MBS stream. |
|     $I_{size\text{-}Offset}$ | 5 | Depends on supported modes, 32 modes assumed as baseline. |
|     MEF | 1 | E-MSB Encoding Format 0b0: SFBC, 0b1: Vertical Encoding |
|     if (MEF == 0b0) { | | |
|       Mt  } | 1 | Number of streams for transmission for Nt = 2, Nt = 4, and Nt = 8 (Mt <= Nt) 0b0: 1 stream, 0b1: 2 stream |
|     E-MBS Frame/AAI subframe offset | [TBD] | Include the location of the frame/AAI subframe where the E-MBS data burst begins. |
|     E-MBS Resouce Indexing | [TBD] | Include the location of the subcarrier index where the E-MBS data burst begins |
|     Allocation period | [TBD] | Inter-arrival intervals of E-MBS data bursts for an E-MBS stream (in number of frames) |
|   } | | |
| } | | |

In another exemplary embodiment, a rule can be configured for a service in an E-MBS zone setting message for a specific service. For example, in IEEE 802.16m, rules may be provided by E-MBS MAP to indicate that a specific service within a zone is to apply a corresponding kind of rule through an E-MBS_PARTITION_INDICATOR as shown below in Table 7. The E-MBS_PARTITION_INDICATOR may indicate the status for each service flow.

TABLE 7

Exemplary embodiment of resource configuration indicating E-MBS partition

| Syntax | Size (bits) | Notes |
|---|---|---|
| E-MBS-DATA_IE( ) { | | |
|   No. of MSTID+FIDs | 8 | Total number of E-MBS streams in the IE. |
|   for(i=0; i< No. of MSTID+FIDs; i++) { | | |
|     MSTIF+FID | 16 | Multicast STID + Flow ID of an E-MBS stream. |
|     $I_{Size\text{-}Offset}$ | 5 | Depends on supported modes, 32 modes assumed as baseline. |
|     MEF | 1 | E-MSB Encoding Format 0b0: SFBC, 0b1: Vertical Encoding |
|     E-MBS_PARTITION_INDICATOR | | 0: unicast partition rule; 1: E-MBS partition rule |
|     if (MEF == 0b0) { | | |
|       Mt  } | 1 | Number of streams for transmission for Nt = 2, Nt = 4, and Nt = 8 (Mt <= Nt) 0b0: 1 stream, 0b1: 2 stream |
|     E-MBS Frame/AAI subframe offset | [TBD] | Include the location of the frame/AAI subframe where the E-MBS data burst begins. |
|     E-MBS Resouce Indexing | [TBD] | Include the location of the subcarrier index where the E-MBS data burst begins |
|     Allocation period | [TBD] | Inter-arrival intervals of E-MBS data bursts for an E-MBS stream (in number of frames) |
|   } | | |
| } | | |

Exemplary embodiments may therefore provide for a correspondence to be provided between the upper layer block size and codeword length of the FEC encoded blocks. This is contrary to conventional structures which tend to provide codeword lengths that are larger than the upper layer block sizes and may therefore suffer from contiguous errors and/or reception latency. Thus, whereas conventionally, the codeword length tends to be larger than the upper layer block size, which results in a large codeword in the physical layer and therefore requires larger register size and latency at the receiver side, exemplary embodiments may provide for a resource unit that may be set up to provide less mismatch between upper layer block size and physical layer encoded block size. Thus, for example, register size and latency at the receiver may be reduced. Moreover, exemplary embodiments that set the physical layer block size (that may be limited to the resource unit size) to be equal to the upper layer block sizes may avoid contiguous errors, reduce error detection overhead and provide relatively efficient resource utilization. As such, exemplary embodiments may reduce physical layer code block size to fit the upper layer block size. The size of the physical layer code block size (or size of the resource unit to be used) may be defined in the system. Decoding of the FEC encoded blocks received at a receiver (e.g., a mobile station or advanced mobile station) may happen in reverse of the operations shown in FIGS. 4 and 9.

FIG. 11 illustrates an example of structure that may be employed to execute some exemplary embodiments. In this regard, FIG. 11 illustrates an apparatus 400 that may be embodied at or as either a mobile station (e.g., an AMS) or a base station configurable to perform exemplary embodiments. The apparatus 400 may include a processor 410. The processor 410 may be embodied in a number of different ways. For example, the processor 410 may be embodied as various processing means such as a processing element, a coprocessor, a controller or various other processing devices including integrated circuits such as, for example, an ASIC (application specific integrated circuit), an FPGA (field programmable gate array), a hardware accelerator, or the like. In an exemplary embodiment, the processor 410 may be configured to execute instructions stored in a memory device or otherwise accessible to the processor 410. By executing stored instructions or operating in accordance with hard coded instructions, the processor 410 may control the operation of the apparatus 400 by directing functionality of the apparatus 400 associated with implementing resource unit based partitioning described above according to the respective configuration provided to the apparatus 400 by the processor 410 and/or the instructions stored in memory for configuring the processor 410. As such, whether configured by hardware or software methods, or by a combination thereof, the processor 410 may represent an entity capable of performing operations according to exemplary embodiments while configured accordingly.

The apparatus 400 may also include a storage module 420. The storage module 420 may include, for example, volatile and/or non-volatile memory. The storage module 420 may be configured to store information, instructions and/or the like. For example, the storage module 420 could be configured to buffer data for processing by the processor 410 or prior to transmission or successive to reception. Additionally or alternatively, the storage module 420 could be configured to store instructions for execution by the processor 410. The storage module 420 may be an integrated part of the apparatus 400 or may be a removable memory device.

In some embodiments, the apparatus 400 may further include an interface module 430. The interface module 430 may include hardware, and in some cases also software for configuring the hardware, for enabling the apparatus 400 to interface with other devices and users, if applicable. Thus, for example, if the apparatus 400 is embodied as a mobile station, the interface module 430 may include a user interface providing, for example, display, keyboard, soft keys, touch screen interface, mouse, joystick, microphone, speaker, and/or any other user interface capabilities that a mobile station may employ. The interface module 430 may also include circuitry and/or components to enable inter-device interface as well. As such, the interface module 430 may include wired and/or wireless interface circuitry such as an antenna (or antennas) and corresponding transmission and receiving circuitry to enable wireless communication with other devices over a radio access technology.

In an exemplary embodiment, the processor 410 and/or the storage module 420 may comprise portions of processing circuitry configured to cause the apparatus 400 to perform functionality according to the configuration either hardwired into the processor 410 or provided by the execution of instructions stored in the storage module 420. As such, the apparatus 400 may be configured to control resource unit based partitioning as described above according to the perspective of the mobile station or the base station in which the apparatus 400 is employed. As such, when employed in a base station or mobile station, the apparatus 400 may be configured to encode data using resource unit based partitioning rules as described above or decode data using a reverse procedure. Accordingly, the apparatus 400 may be configured for determining, for a bit stream to be encoded in a coding scheme including an upper layer coding and a physical layer coding, whether upper layer coding is enabled. The apparatus 400 may further be configured for, in response to the upper layer coding being enabled, partitioning the bit stream into one or more blocks for forward error correction coding. The one or more blocks may have a block size determined based on a size of a resource unit. The resource unit size may correspond to one or more units predefined in the physical layer for the resource allocation. As such, the apparatus 400 may be configured to perform the method described in connection with FIGS. 12 and/or 13 below, with or without the modifications described below.

FIGS. 12 and 13 are flowcharts of a system, method and program product according to exemplary embodiments. It will be understood that each block or step of the flowcharts, and combinations of blocks in the flowcharts, can be implemented by various means, such as hardware, firmware, and/or software including one or more computer program instructions. For example, one or more of the procedures described above may be embodied by computer program instructions. In this regard, in an exemplary embodiment, the computer program instructions which embody the procedures described above are stored by a memory device and executed by a processor or controller. As will be appreciated, any such computer program instructions may be loaded onto a computer or other programmable apparatus (i.e., hardware) to produce a machine, such that the instructions which execute on the computer or other programmable apparatus create means for implementing the functions specified in the flowcharts block(s) or step(s). In some embodiments, the computer program instructions are stored in a computer-readable memory that can direct a computer or other programmable apparatus to function in a particular manner, such that the instructions stored in the computer-readable memory produce an article of manufacture including instruction means which implement the function specified in the flowcharts block(s) or step(s). The computer program instructions may also be loaded onto a computer or other programmable apparatus to cause a series of operations to be performed on the computer or other programmable apparatus to produce a computer-implemented process such that the instructions which execute on the computer or other programmable apparatus provide steps for implementing the functions specified in the flowcharts block(s) or step(s).

Accordingly, blocks or steps of the flowcharts support combinations of means for performing the specified functions, combinations of operations for performing the specified functions and program instruction means for performing the specified functions. It will also be understood that one or more blocks or steps of the flowcharts, and combinations of blocks or steps in the flowcharts, can be implemented by special purpose hardware-based computer systems which perform the specified functions or steps, or combinations of special purpose hardware and computer instructions.

One embodiment of a method for providing resource unit based data block partitioning as provided in FIG. 12 may include determining, for a bit stream to be encoded in a coding scheme including an upper layer coding and a physical layer coding, whether upper layer coding is enabled at operation 500. The method may further include, in response to the upper layer coding being enabled, partitioning the bit stream into one or more blocks for forward error correction coding at operation 510. The one or more blocks may have a block size determined based on a size of a resource unit. The resource unit size may correspond to one or more units predefined in the physical layer for the resource allocation.

In some embodiments, certain ones of the operations above may be modified or further amplified as described below. Moreover, in some cases, embodiments may include additional operations (and example of which is shown in dashed lines in FIG. 12). It should be appreciated that each of the modifications, additions or amplifications below may be included with the operations above either alone or in combination with any others among the features described herein. In an exemplary embodiment, the method may further include allocating one or more bits of a configuration message to indicate application of a data block partition rule at operation 520. In some embodiments, partitioning the bit stream may include partitioning the bit stream into one or more blocks having a block size of the resource unit which may be defined as one RU, multiple RUs, one sub-band, multiple sub-bands, one mini-band or multiple mini-bands for WiMAX related implementations, or partitioning the bit stream into one or more blocks having a block size of the resource unit corresponding to one resource block (RB) or multiple resource blocks (RBs) for Long Term Evolution (LTE) implementations. In an exemplary embodiment, partitioning the bit stream may include partitioning the bit stream such that data block size in the upper layer corresponds to a size of the one or more blocks for forward error correction coding excluding padded bits for error detection. In some cases, a duration of performing the upper layer coding fits one or multiple physical layer scheduling intervals (e.g., the physical layer scheduling interval may be the E-MBS scheduling interval (MSI) for IEEE 802.16m E-MBS. In an exemplary embodiment, the upper layer may be configured to reuse an error detection result of the forward error correction blocks in the physical layer. In some embodiments, in response to the upper layer coding being enabled, a smaller resource size may be allocated to avoid a large burst size or a total resource allocation may be divided into multiple smaller resource allocations to generate multiple smaller sub-bursts.

Another embodiment of a method for decoding data employing resource unit based data block partitioning as provided in FIG. 13 may include receiving a bit stream encoded in a coding scheme including an upper layer coding and a physical layer coding at operation 600 and decoding the bit stream based on the bit stream being partitioned into one or more blocks for forward error correction coding at operation 610. The one or more blocks may have a block size determined based on a size of a resource unit. The resource unit size may correspond to one or more units predefined in the physical layer for the resource allocation.

In some embodiments, certain ones of the operations above may be modified or further amplified as described below. It should be appreciated that each of the modifications or amplifications below may be included with the operations above either alone or in combination with any others among the features described herein. In this regard, for example, decoding the bit stream may include decoding the bit stream based on the bit stream being partitioned into one or more blocks having a block size of a resource unit which may be defined as one RU, multiple RUs, one sub-band, multiple sub-bands, one mini-band or multiple mini-bands for WiMAX related implementations, or one resource block (RB) or multiple resource blocks (RBs) for Long Term Evolution (LTE) implementations. In some embodiments, decoding the bit stream may include decoding the bit stream based on the bit stream being partitioned such that data block size in the upper layer corresponds to a size of the one or more blocks for forward error correction coding excluding padded bits for error detection. In an exemplary embodiment, decoding the bit stream may include decoding the bit stream based on the bit stream being partitioned with a smaller resource allocation size to avoid a large burst size or with a total resource allocation divided into multiple smaller resource allocations to generate multiple smaller sub-bursts.

The text and figures included herein provide examples of embodiments, and provide support for a system, method, apparatus, and computer program product according to exemplary embodiments. It will be understood that each operation of the figures and/or text, and/or combinations of operations in the figures and/or text, can be implemented by various means. Means for implementing the operations of the figures and/or text, and/or combinations of the operations in the flowcharts and/or associated text may include hardware such as circuitry, integrated circuit devices, or the like. A hardware embodiment or means may include a hardware device that is specifically designed and configured for implementation of the operations described herein, a hardware element that is configured under the direction of program code or instructions according to the operations described herein, or a combination of both. Examples of such hardware embodiments or means may include an Application Specific Integrated Circuit (ASIC), a Programmable Logic Device (PLD), a Field Programmable Logic Array (FPGA), a processor, or other programmable apparatus. Embodiments of the present disclosure may also take the form of one or more of the operations described herein embodied as program code instructions stored on a computer-readable storage medium. As defined herein a "computer-readable storage medium," which refers to a physical storage medium (e.g., volatile or non-volatile memory device), can be differentiated from a "computer-readable transmission medium," which refers to an electromagnetic signal.

The program code instructions which embody the operations may be stored by or on a computer-readable storage medium, such as a memory device of an apparatus, and executed by one or more hardware devices. As will be appreciated, program code instructions may be loaded onto a hardware device to produce a particular and specially configured machine for implementing the operations described in the figures and/or text. Embodiments of the present disclosure may include hardware devices that load and execute the operations in a sequential manner, or hardware devices that load and/or execute some or all of the operations simultaneously.

It will be appreciated by one of skill in the art that the exemplary embodiments of the present disclosure provided herein describe some, but not all embodiments of the invention. Indeed, the invention may be embodied in many different forms and should not be construed as limited to the embodiments set forth herein; rather, these embodiments are provided so that this disclosure will satisfy applicable legal requirements.

Many modifications and other embodiments of the disclosures set forth herein will come to mind to one skilled in the art to which these inventions pertain to having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the present invention. Although specific terms are employed herein, they are used in a generic and descriptive sense only and not for purposes of limitation.

What is claimed is:

1. A method for determining the size of data block of upper layer coding for partitioning a bit stream corresponding to physical layer coding, the method comprising:
   determining a number of used resource units for a forward error correction (FEC) block at the physical layer; and
   determining a number of information bits to one FEC block based on the number of used resource units; and
   determining the size of data block of upper layer coding based on the number of information bits of one FEC block for the upper layer coding.

2. The method of claim 1, wherein the resource unit comprises $P_{sc}$ consecutive subcarriers by $N_{sym}$ consecutive OFDMA symbols where $P_{sc}$ and $N_{sym}$ are positive integers.

3. The method of claim 1, wherein the resource unit corresponds to one or more resource units, one or more sub-bands, or one or more mini-bands for WiMAX-related implementations.

4. The method of claim 1, wherein the resource unit corresponds to one or more resource blocks for Long Term Evolution implementations.

5. The method of claim 1, wherein the size of data block corresponds to one or a multiple of the number of information bits of a FEC block.

6. The method of claim 1, wherein a duration of performing the upper layer coding fits one or multiple physical layer scheduling intervals.

7. The method of claim 1, further comprising allocating one or more bits of a configuration message to indicate application of a data block partition rule.

8. The method of claim 1, wherein the upper layer is configured to reuse an error detection result of the forward error correction blocks in the physical layer.

9. The method of claim 1, further comprising:
determining whether the upper layer coding is enabled; and
allocating a smaller resource size to avoid a large burst size or dividing a total resource allocation into multiple smaller resource allocations to generate multiple smaller sub-bursts.

10. The method of claim 1, further comprising:
determining whether the upper layer coding is enabled; and
in response to the upper layer coding being enabled, partitioning the bit stream into one or more blocks for FEC coding, the one or more blocks having a block size determined based on a size of a resource unit, the resource unit size corresponding to one or more units predefined at the physical layer for the resource allocation.

11. An apparatus for determining the size of data block of upper layer coding for partitioning a bit stream corresponding to physical layer coding, the apparatus comprising processing circuitry configuring the apparatus to:
determining a number of used resource units for a forward error correction (FEC) block at the physical layer; and
determining a number of information bits to one FEC block based on the number of used resource units; and
determining the size of data block of upper layer coding based on the number of information bits of one FEC block for the upper layer coding.

12. The method of claim 11, wherein the resource unit comprises $P_{sc}$ consecutive subcarriers by $N_{sym}$ consecutive OFDMA symbols where $P_{sc}$ and $N_{sym}$ are positive integers.

13. The apparatus of claim 11, wherein the resource unit corresponds to one or more resource units, one or more sub-bands, or one or more mini-bands for WiMAX related implementations.

14. The apparatus of claim 11, wherein the resource unit corresponds to one or more resource blocks for Long Term Evolution (LTE) implementations.

15. The apparatus of claim 11, wherein the size of data block corresponds to one or a multiple of the number of information bits of a FEC block.

16. The apparatus of claim 11, wherein a duration of performing the upper layer coding fits one or multiple physical layer scheduling intervals.

17. The apparatus of claim 11, wherein the processing circuitry further configures the apparatus to allocate one or more bits of a configuration message to indicate application of a data block partition rule.

18. The apparatus of claim 11, wherein the upper layer is configured to reuse an error detection result of the forward error correction blocks in the physical layer.

19. The apparatus of claim 11, further comprising:
determining whether the upper layer coding is enabled; and
allocating a smaller resource size to avoid a large burst size or dividing a total resource allocation into multiple smaller resource allocations to generate multiple smaller sub-bursts.

20. The apparatus of claim 11, further configured for:
determining whether the upper layer coding is enabled; and
in response to the upper layer coding being enabled, partitioning the bit stream into one or more blocks for FEC coding, the one or more blocks having a block size determined based on a size of a resource unit, the resource unit size corresponding to one or more units predefined at the physical layer for the resource allocation.

21. A method for decoding data employing resource unit based data block partitioning, the method comprising:
receiving a bit stream encoded in a coding scheme including an upper layer coding and a physical layer coding; and
decoding the bit stream based on the bit stream being partitioned into one or more blocks for forward error correction coding, the one or more blocks having a block size determined based on a size of a resource unit, the resource unit size corresponding to one or more units predefined at the physical layer for the resource allocation.

22. The method of claim 21, wherein the resource unit comprises $P_{sc}$ consecutive subcarriers by $N_{sym}$ consecutive OFDMA symbols where $P_{sc}$ and $N_{sym}$ are positive integers.

23. The method of claim 21, wherein the resource unit may correspond to one or more resource units, one or more sub-bands, or one or more mini-bands for WiMAX related implementations or correspond to one or more resource blocks for Long Term Evolution (LTE) implementations.

24. The method of claim 21, wherein decoding the bit stream comprises decoding the bit stream based on the bit stream being partitioned such that data block size in the upper layer corresponds to a size of the one or more blocks for forward error correction coding excluding padded bits for error detection.

25. The method of claim 21, wherein decoding the bit stream comprises decoding the bit stream based on the bit stream being partitioned with a smaller resource allocation size to avoid a large burst size or with a total resource allocation divided into multiple smaller resource allocations to generate multiple smaller sub-bursts.

26. An apparatus for decoding data employing resource unit based data block partitioning, the apparatus comprising processing circuitry configuring the apparatus to:
receive a bit stream encoded in a coding scheme including an upper layer coding and a physical layer coding; and
decode the bit stream based on the bit stream being partitioned into one or more blocks for forward error correction coding, the one or more blocks having a block size determined based on a size of a resource unit, the resource unit size corresponding to one or more units predefined at the physical layer for the resource allocation.

27. The method of claim 26, wherein the resource unit comprises $P_{sc}$ consecutive subcarriers by $N_{sym}$ consecutive OFDMA symbols where $P_{sc}$ and $N_{sym}$ are positive integers.

28. The apparatus of claim 26, wherein the resource unit may correspond to one or more resource units, one or more sub-bands, or one or more mini-bands for WiMAX related implementations or correspond to one or more resource blocks for Long Term Evolution (LTE) implementations.

29. The apparatus of claim 26, wherein the processing circuitry further configures the apparatus to decode the bit stream by decoding the bit stream based on the bit stream being partitioned such that data block size in the upper layer corresponds to a size of the one or more blocks for forward error correction coding excluding padded bits for error detection.

30. The apparatus of claim 26, wherein the processing circuitry further configures the apparatus to decode the bit stream by decoding the bit stream based on the bit stream being partitioned with a smaller resource allocation size to avoid a large burst size or with a total resource allocation divided into multiple smaller resource allocations to generate multiple smaller sub-bursts.

* * * * *